United States Patent
Tanaka

(10) Patent No.: US 7,872,537 B2
(45) Date of Patent: Jan. 18, 2011

(54) SURFACE-MOUNT CRYSTAL OSCILLATOR

(75) Inventor: Yoshikatsu Tanaka, Saitama (JP)

(73) Assignee: Nihon Dempa Kogyo Co., Ltd. (JP)

( * ) Notice: Subject to any disclaimer, the term of this patent is extended or adjusted under 35 U.S.C. 154(b) by 138 days.

(21) Appl. No.: 12/205,068

(22) Filed: Sep. 5, 2008

(65) Prior Publication Data

US 2009/0058544 A1 Mar. 5, 2009

(30) Foreign Application Priority Data

Sep. 5, 2007 (JP) ............................ 2007-230071

(51) Int. Cl.
  *H03B 1/00* (2006.01)
(52) U.S. Cl. ........................................ 331/68; 331/158
(58) Field of Classification Search .................. 331/68, 331/158; 310/344, 340, 346, 311
See application file for complete search history.

(56) References Cited

U.S. PATENT DOCUMENTS 7,034,441 B2 * 4/2006 Ono et al. ................... 310/344

2006/0055479 A1 * 3/2006 Okazaki et al. ............. 331/158
2007/0120614 A1 * 5/2007 Moriya et al. ............... 331/158

FOREIGN PATENT DOCUMENTS

JP 2005-311769 11/2005

* cited by examiner

*Primary Examiner*—Robert Pascal
*Assistant Examiner*—Ryan Johnson
(74) *Attorney, Agent, or Firm*—Cantor Colburn LLP

(57) ABSTRACT

A surface-mount crystal oscillator includes: a crystal blank; an IC chip in which at least an oscillation circuit using the crystal blank is integrated, a plurality of IC terminals are provided on one principal surface, and a plurality of mounting terminals for surface mounting are provided on the other principal surface; and a housing member joined to the one principal surface of the IC chip and formed into a recessed shape. The crystal blank is fixed to crystal connection terminals out of the IC terminals, and is hermetically encapsulated in a space formed by the IC chip and the housing member. At least a power supply terminal, an output terminal and a ground terminal out of the IC terminals are electrically connected to the mounting terminals by a through-electrode provided to penetrate through the IC chip.

8 Claims, 3 Drawing Sheets

SURFACE-MOUNT CRYSTAL OSCILLATOR

BACKGROUND OF THE INVENTION

1. Field of the Invention

The present invention relates to a surface-mount crystal oscillator, and more particularly, to a surface-mount crystal oscillator more suitable for miniaturization.

2. Description of the Related Arts

Surface-mount crystal oscillators each including a quartz crystal blank and an IC chip containing an oscillation circuit using the crystal blank, and having a structure suitable for surface mounting are widely used as reference sources of frequency and time in portable electronic equipment represented by, for example, portable telephones because of their compactness and light weight. As such a surface-mount crystal oscillator, Japanese Patent Laid-Open No. 2005-311769 (JP-A-2005-311769) discloses the one in which an IC chip and a crystal blank are integrated, and are hermetically encapsulated in a container. FIG. 1A is a cross-sectional view showing one example of a configuration of such a conventional surface-mount crystal oscillator, and FIG. 1B is a plan view of an IC chip used in the crystal oscillator.

The illustrated crystal oscillator includes container body 1 which is constituted of laminated ceramics, and has a flat rectangular parallelepiped shape, with a recess formed on one principal surface. IC chip 2 and crystal blank 3 are housed in the recess of container body 1, and hermetically encapsulated in the recess by covering the recess with metal cover 4.

IC chip 2 is in a substantially rectangular shape, in which electronic circuits including an oscillation circuit using crystal blank 3 are integrated on a semiconductor substrate. In the example shown here, a temperature compensating mechanism for compensating a frequency-temperature characteristic of crystal blank 2 as a quartz crystal element, and enhancing stability of oscillation frequency with respect to a temperature change is also integrated in IC chip 2. Accordingly, the crystal oscillator is configured as a temperature compensated crystal oscillator (TCXO).

The electronic circuits such as the oscillation circuit and the temperature compensating mechanism are formed on one principal surface of the semiconductor substrate in IC chip 2 by an ordinary semiconductor device fabricating process. Thus, out of both principal surfaces of IC chip 2, the surface on which the electronic circuits are formed in the semiconductor substrate will be called as a circuit formation surface. A plurality of IC terminals for connecting the electronic circuits in IC chip 2 to an external circuit are provided on the circuit formation surface as shown in FIG. 1B. These IC terminals include crystal connection terminals $5x$, $5y$ which are used for electrical connection with crystal blank 3, and further include IC external terminals $5z$ which include at least a power supply terminal, an output terminal and a ground terminal. In FIG. 1B, the dashed line shows the disposed position of crystal blank 3. In the example shown here, IC external terminals $5z$ further include an AFC terminal used for input of an automatic frequency control (AFC) signal. Further, as one of the IC external terminals, write terminal $5z1$ used for writing temperature compensation data to the temperature compensating mechanism is provided.

When the temperature compensation data can be supplied into IC chip 2 by using other IC external terminals $5z$, write terminal $5z1$ specially designed for writing the temperature compensation data is not formed.

IC external terminals $5z$ including write terminal $5z1$ are connected to back surface terminals 15 formed on the other principal surface, that is, the principal surface which is not the circuit formation surface, of IC chip 2 via through-electrode 6 formed in IC chip 2. Crystal connection terminals $5x$, $5y$, IC external terminals $5z$, $5z1$ and back surface terminals 15 are all formed on the semiconductor substrate configuring IC chip 2 as square or rectangular electrode pads.

On an inner bottom surface of the recess of container body 1, circuit terminals (not shown) which are used for electrical connection with IC chip 2 are provided corresponding to the positions of back surface terminals 15 in IC chip 2. Back surface terminals 15 are electrically joined to the circuit terminals by using a so-called flip chip bonding technique such as ultrasonic thermo-compression bonding using bumps 7, whereby IC chip 2 is fixed to the inner bottom surface of the recess, and electrically and mechanically connected to container body 1.

A plurality of mounting terminals 8 which are used when the crystal oscillator is surface-mounted on a wiring board are provided as an electrode layer on an outer bottom surface of container body 1. Circuit terminals of the inner bottom surface of the recess are electrically connected to mounting terminals 8 via conductive paths formed in container body 1. Mounting terminals 8 include at least a ground terminal, a power supply terminal and an output terminal. In this example, mounting terminals further include an AFC terminal and a write terminal for temperature compensation data.

Crystal blank 3 which is used in such a crystal oscillator is constituted of, for example, a substantially rectangular AT-cut quartz crystal blank, and excitation electrodes $9a$ are formed on both principal surfaces of the crystal blank, as shown in FIG. 2. From a pair of excitation electrodes $9a$, lead electrodes $9b$ are extended to both sides of one end portion of crystal blank 3. Lead electrode $9b$ is formed at a position of the end portion of crystal blank 3 to be folded back between both the principal planes of crystal blank 3. Crystal blank 3 is fixed to IC chip 2 and electrically connected to IC chip 2 by fixing lead electrodes $9b$ respectively to crystal connection terminals $5x$, $5y$ on the circuit formation surface of IC chip 2 by, for example, conductive adhesive 10 at the position where a pair of lead electrodes $9b$ are led.

Metal cover 4 which is used for closing the recess of container body 1 is joined to an opening end surface of container body 1, that is, a surface which is a top surface of container body 1 and surrounds the recess, by seam welding or thermo-compression bonding. When seam welding is used, a metal ring is provided on the top surface of container body 1 along an outer perimeter of the recess, and metal cover 4 is joined to the metal ring. When thermo-compression bonding is used, joining is performed by using a eutectic alloy such as Au—Sn (gold-tin). In any case, metal film 11 is provided on the opening end surface of container body 1. Metal film 11 is electrically connected to the ground terminal out of mounting terminals 8 by a through-hole and the like (not shown) provided in a frame wall portion of container body 1, whereby metal cover 4 is electrically grounded.

A bottom wall of container body 1 has a structure in which a plurality of ceramic sheets are laminated, for example, and shield electrode layer 12 is formed on a lamination plane between these ceramic sheets. Shield electrode layer 12 is also electrically connected to the ground terminal of mounting terminals 8 by a through-hole or a via-hole formed in container body 1. Both metal cover 4 and shield electrode layer 12 are grounded, and thereby, IC chip 2 and crystal blank 3 are electrically shielded in both upper and lower directions.

However, in the surface-mount crystal oscillator of the above described configuration, since IC chip 2 and crystal blank 3 are integrated and housed in the recess of container body 1, the size of the crystal oscillator is determined by the height and the planar outer shape of container body 1 which do not directly relate to the actual function as the crystal oscillator. Accordingly, the planar outer shape and the height dimension of the surface-mount crystal oscillator cannot be made smaller than the size of container body 1 which can house the integrated IC chip 2 and crystal blank 3.

SUMMARY OF THE INVENTION

An object of the present invention is to provide a surface-mount crystal oscillator which can realize additional miniaturization.

The object of the present invention is achieved by a surface-mount crystal oscillator, comprising: a crystal blank; an IC chip in which at least an oscillation circuit using the crystal blank is integrated, a plurality of IC terminals are provided on one principal surface, and a plurality of mounting terminals for surface mounting are provided on the other principal surface; and a housing member joined to the one principal surface of the IC chip and formed into a recessed shape, wherein the plurality of IC terminals are constituted of a crystal connection terminal used for connection with the crystal blank, and IC external terminals including at least a power supply terminal, an output terminal and a ground terminal, the IC external terminals and the mounting terminals are electrically connected by a through-electrode provided to penetrate through the IC chip, the crystal blank is fixed to the crystal connection terminal, the crystal blank being held by the IC chip, and the crystal blank is hermetically encapsulated in a space formed by the IC chip and the housing member.

According to such a configuration, the IC chip itself is used as the bottom wall of the container for hermetically encapsulating the crystal blank. As a result, in this configuration, a container body in which the recess is included and the IC chip is fixed to the inner bottom surface of the recess is not required, and the planar outer shape dimension of the crystal oscillator can be made small by the size of the container body. More specifically, the planar outer shape dimension of the crystal oscillator can be made the planar outer shape dimension of the IC chip. Further, according to the present invention, the height dimension of the crystal oscillator can be made small by the amount of the thickness of the bottom wall of the container body in the conventional crystal oscillator. Consequently, according to the present invention, further miniaturization of the surface-mount crystal oscillator can be achieved.

DETAILED DESCRIPTION OF THE REFERRED EMBODIMENTS

Figure 1A:
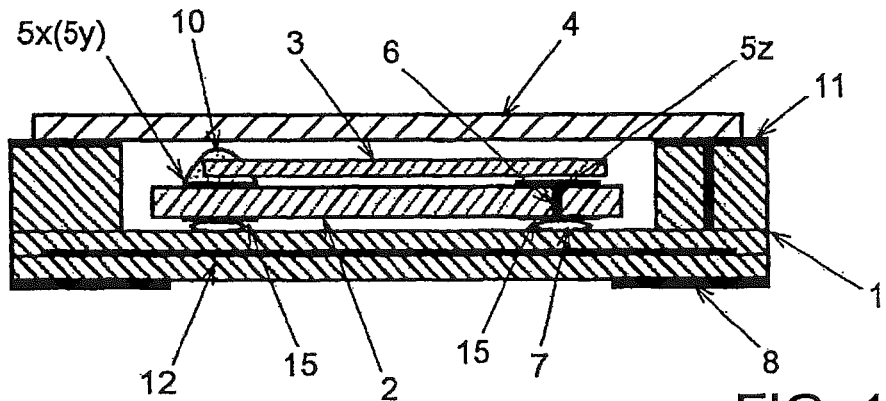
FIG. 1A is a cross-sectional view showing one example of a configuration of a conventional surface-mount crystal oscillator.
Figure 1B:
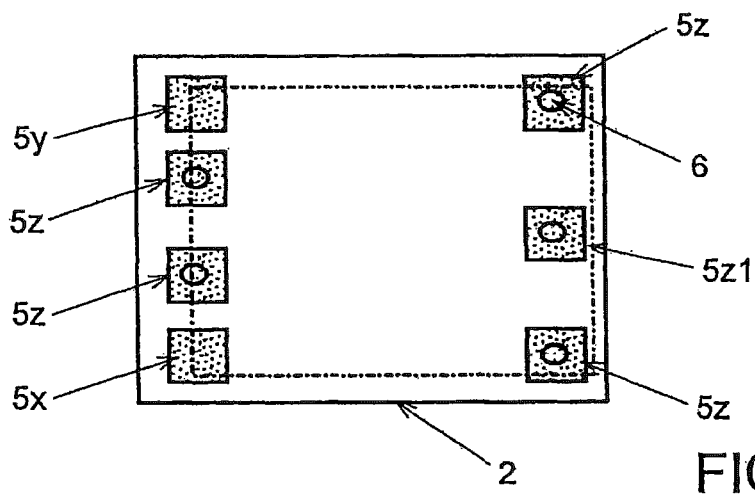
FIG. 1B is a plan view of an IC chip used in the crystal oscillator shown in FIG. 1A.
Figure 3A:
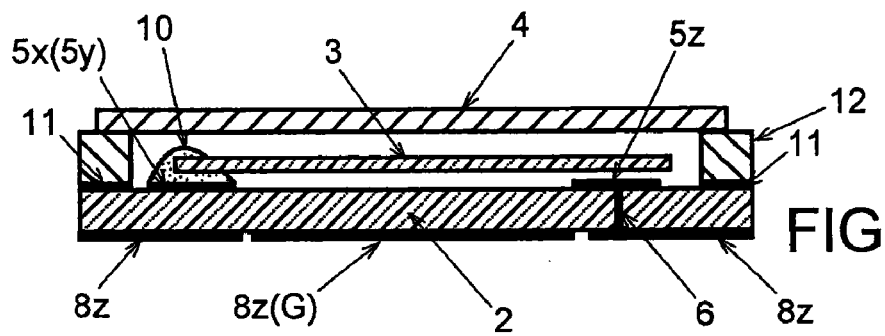
FIG. 3A is a cross-sectional view showing a configuration of a surface-mount crystal oscillator according to one embodiment of the present invention.
Figure 3B:
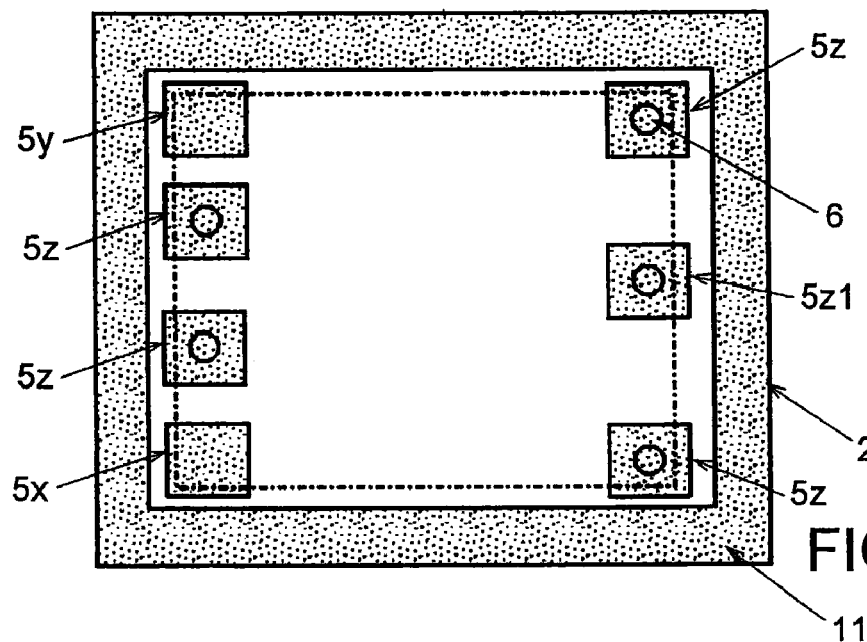
FIGS. 3B and 3C are respectively a plan view and a bottom view of an IC chip used in the crystal oscillator shown in FIG. 3A.
Figure 3C:
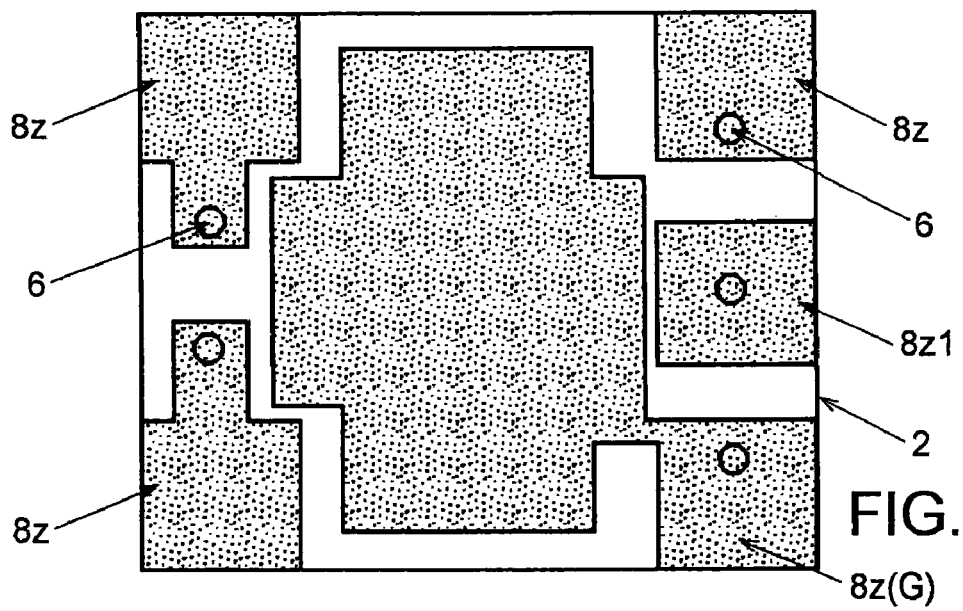

In FIGS. 3A to 3C showing a surface-mount crystal oscillator according to one embodiment of the present invention, the same components as those in FIGS. 1A and 1B are assigned with the same reference numerals, and the redundant explanation will be omitted or simplified.

Figure 2:
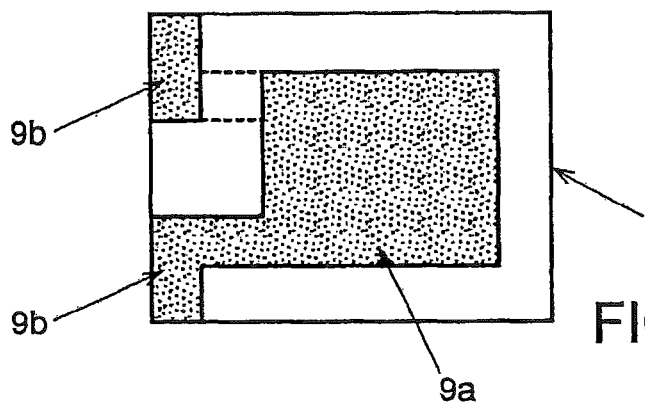
FIG. 2 is a plan view of a crystal blank.

The surface-mount crystal oscillator of the present embodiment has a configuration in which quartz crystal blank 3 is fixed to IC chip 2 as in the above described one, but differs from the above described one in the point that IC chip 2 itself is used as a bottom wall of a container for hermetically encapsulating crystal blank 3. As crystal blank 3, the one described by using FIG. 2 is used a it is.

An oscillation circuit using crystal blank 3 and a temperature compensating mechanism which compensates the frequency-temperature characteristic of crystal blank 3 are integrated in IC chip 2 as described above. The circuit formation surface of IC chip 2 includes a plurality of IC terminals as shown in FIG. 3B. The IC terminals include a pair of crystal connection terminals $5x$, $5y$ and a plurality of IC external terminals $5z$. IC external terminals $5z$ include a power supply terminal, an output terminal, a ground terminal and an AFC terminal, and also includes write terminal $5z1$ for writing temperature compensation data to the temperature compensating mechanism. Crystal connection terminals $5x$, $5y$ and the IC external terminals are provided in two rows to be along a pair of opposing sides of IC chip 2. When write of temperature compensation data can be performed by using other IC external terminals $5z$, special write terminal $5z1$ does not have to be provided. In FIG. 3B, the dashed line indicates the disposed position of crystal blank 3.

Mounting terminals $8z$ which are used when the crystal oscillator is surface-mounted on a wiring board are provided at four corner portions of the other principal surface, that is, a principal surface which is not the circuit formation surface, of IC chip 2, as shown in FIG. 3C. These four mounting terminals $8z$ are a power supply terminal, an output terminal, a ground terminal and an AFC terminal. The mounting terminal which is especially used as the ground terminal is assigned with reference numeral $8z(G)$.

IC external terminals $5z$ are electrically connected to corresponding mounting terminals $8z$ respectively by through-electrodes 6 which are formed to penetrate through a semiconductor substrate of IC chip 2. Further, write terminal $5z1$ is also electrically connected to write external terminal $8z1$ which is formed on the other principal surface of IC chip 2 by though-electrode 6 which is similarly formed.

Ground terminal $8z(G)$ out of the mounting terminals is not only formed at one corner portion of the other principal surface of IC chip 2, but also formed to extend in a central region of the other principal surface of IC chip 2. Thereby, ground terminal $8z(G)$ is formed on a substantially entire surface of the other principal surface of IC chip 2 except for a formation region of mounting terminals $8z$ and write external terminal $8z1$ other than the ground terminal.

In crystal blank 3, both sides of one end portion where lead electrodes $9b$ are extended is fixed to crystal connection terminals $5x$, $5y$ of IC chip 2 by, for example, conductive adhesive 10 as in the above described case, whereby crystal blank 3 is held by IC chip 2 and is electrically connected to IC chip 2.

In the circuit formation surface of IC chip 2, metal film 11 is provided to go around its outermost perimeter. Metal film 11 is electrically connected to the ground terminal of IC external terminals $5z$, or electrically connected to ground terminal 8z(G) of mounting terminals 8 by through-electrode 6. One end surface of metal frame 12 in a square cylinder shape is joined to metal film 11 by a eutectic alloy (not shown) such as Au—Sn. Metal frame 12 is a member which configures a side wall of the container which houses crystal blank 3. Planar metal cover 4 is joined to the other end surface of metal frame 12 by seam welding or thermo-compression bonding. Thereby, the recess by metal frame 12 is closed by metal cover 4, and crystal blank 3 is hermetically encapsulated in a space defined by IC chip 2, metal frame 12 and metal cover 4.

When such a crystal oscillator is assembled, metal frame 12 is joined to the circuit formation surface of IC chip 2 in advance, and thereafter, both sides of the one end portion of crystal blank 3 may be fixed to crystal connection terminals 5x, 5y. Alternatively, metal frame 12 may be joined to IC chip 2 after both sides of the one end portion of crystal blank 3 are fixed to crystal connection terminals 5x, 5y, and thereafter, metal cover 4 is joined to the metal frame.

In such a surface-mount crystal oscillator, IC chip 2 itself is used as the bottom wall of the container which houses crystal blank 3, and a planar outer shape dimension of IC chip 2 directly corresponds to the planar outer shape dimension of the crystal oscillator. As compared with the conventional crystal oscillator shown in FIGS. 1A and 1B which houses IC chip 2 in a container body, the planar outer shape dimension of the crystal oscillator of the present embodiment can be made small. Further, if the same planar outer shape dimension as the conventional crystal oscillator is able to be adopted, the planar outer shape dimension of IC chip 2 is made large, and a larger number of circuit functions can be integrated in IC chip 2 according to the present embodiment. Specifically, according to the present embodiment, the advantage is provided when IC chip 2 is enhanced in functionality by providing a temperature compensating mechanism and the like.

In the crystal oscillator of the present embodiment, the bottom wall of the container is configured by IC chip 2, and therefore, as compared with the conventional one, the height dimension can be made small by the amount of the thickness of the bottom wall of the container body configured by laminated ceramics. In this configuration, the circuit formation surface side of IC chip 2 is in contact with a hermetically sealed space which houses crystal blank 3, and the circuit formation surface is not exposed to ambient air. Accordingly, a protection resin layer for protecting the circuit formation surface from ambient air is not required.

In the crystal oscillator of the present embodiment, since ground terminal 8z(G) is provided on a substantially entire surface of the other principal surface of IC chip 2, the substantially entire surface of the other principal plane of IC chip 2 can be made a ground potential plane when the crystal oscillator is surface-mounted on a wiring board by a technique of reflow soldering or the like using cream solder. Since metal frame 12 and metal cover 4 are also grounded, crystal blank 3 and IC chip 2 are electrically shielded from all directions. Specifically, according to the configuration, the countermeasures against EMI (electromagnetic interference) and the like can be made sufficient.

Figure 4:
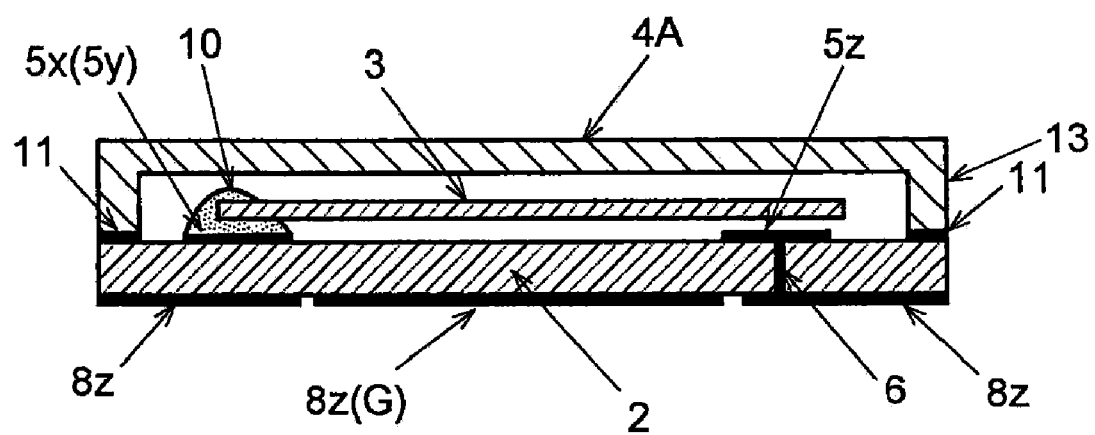
FIG. 4 is a cross-sectional view showing a configuration of a surface-mount crystal oscillator according another embodiment of the present invention.

The crystal oscillator of one embodiment of the present invention is described above, but the crystal oscillator of the present invention is not limited to this. In the crystal oscillator of the above described embodiment, planar metal cover 4 is joined to metal frame 12, but metal cover 13 which is worked into a recessed shape from a planar metal material by machining such as pressing may be joined to the circuit formation surface of IC chip 2, as shown in FIG. 4. As a matter of fact, crystal blank 3 is located in the recess of metal cover 13. In this case, the frame width of the portion where metal cover 13 is joined to IC chip 2 is made narrower than the frame width of the portion where metal frame 12 is joined to IC chip 2. As a result, the inner volume of the space which houses crystal blank 3 can be made large, and crystal blank in a larger shape can be used.

Further, in the crystal oscillator shown in FIGS. 3A to 3C, metal frame 12 is provided on the circuit formation surface of IC chip 2, but a ceramic frame member may be provided instead of metal frame 12. In this case, a metal film is also provided on the end surface of the lower side of the ceramic frame member, and the ceramic frame member can be joined to IC chip 2 by using a eutectic alloy. Subsequently, the metal cover is joined to the top surface of the ceramic frame member by the technique of seam welding or thermo-compression bonding. By a through-hole and the like provided in the frame member, the metal cover is electrically connected to the ground terminal. In such a configuration, since the frame member is nonconductive, the shield effect from all the directions cannot be achieved, but miniaturization of the surface-mount crystal oscillator can be achieved as in the above described case.

In the crystal oscillator shown in FIGS. 3A to 3C, ground terminal 8z(G) is formed on the substantially entire surface of the other principal surface of IC chip 2, but the ground terminal is provided at only one corner portion of the other principal surface and the central region of the other principal surface of IC chip 2 may be bonded to the grounded circuit pattern on the wiring board side by conductive adhesive 10, for example. In this case, the shield effect from all the directions can be obtained as in the above described case.

What is claimed is:

1. A surface-mount crystal oscillator, comprising:
   a crystal blank;
   an IC chip in which at least an oscillation circuit using said crystal blank is integrated, a plurality of IC terminals are provided on one principal surface, and a plurality of mounting terminals for surface mounting are provided on the other principal surface; and
   a housing member joined to said one principal surface of said IC chip and formed into a recessed shape,
   wherein said plurality of IC terminals are constituted of a crystal connection terminal used for connection with said crystal blank, and IC external terminals including at least a power supply terminal, an output terminal and a ground terminal,
   said IC external terminals and said mounting terminals are electrically connected by a through-electrode provided to penetrate through said IC chip,
   said crystal blank is fixed to said crystal connection terminal, said crystal blank being held by said IC chip, and
   said crystal blank is hermetically encapsulated in a space formed by said IC chip and said housing member;
   wherein said mounting terminal for grounding is provided on a substantially entire surface of the other principal surface of said IC chip except area for the other mounting terminals.

2. The crystal oscillator according to claim 1, wherein said housing member comprises: a frame member in which one end is joined to said one principal surface of said IC chip; and a cover which is joined to the other end of said frame member to close an opening by said frame member.

3. The crystal oscillator according to claim 2, wherein said frame member is joined to an outer perimeter portion of said one principal surface of said IC chip by a eutectic alloy.

4. The crystal oscillator according to claim 2, wherein said frame member and said cover are constituted of a metal.

5. The crystal oscillator according to claim 1, wherein said housing member is integrally formed by a metal which is worked into a recessed shape.

6. The crystal oscillator according to claim 5, wherein said housing member is joined to an outer perimeter portion of said one principal plane of said IC chip by a eutectic alloy.

7. The crystal oscillator according to claim 1, wherein said one principal surface of said IC chip is a circuit formation surface of said IC chip.

8. The crystal oscillator according to claim 1, wherein said IC chip includes a temperature compensating mechanism which compensates a frequency-temperature characteristic of said crystal blank.

* * * * *